(12) United States Patent
Lur et al.

(10) Patent No.: US 6,743,721 B2
(45) Date of Patent: Jun. 1, 2004

(54) METHOD AND SYSTEM FOR MAKING COBALT SILICIDE

(75) Inventors: Water Lur, Taipei (TW); David Lee, Hsinchu (TW); Kuang-Chih Wang, Taichung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/166,307

(22) Filed: Jun. 10, 2002

(65) Prior Publication Data

US 2003/0228745 A1 Dec. 11, 2003

(51) Int. Cl.[7] .............................................. H01L 21/44
(52) U.S. Cl. ..................... 438/683; 438/655; 438/656; 438/682
(58) Field of Search ................................ 438/655, 656, 438/664, 682, 683

(56) References Cited

U.S. PATENT DOCUMENTS

| | | |
|---|---|---|
| 4,885,134 A | 12/1989 | Hatwar |
| 4,920,073 A | 4/1990 | Wei et al. |
| 5,047,367 A | 9/1991 | Wei et al. |
| 5,282,946 A | 2/1994 | Kinoshita et al. |
| 5,302,552 A | 4/1994 | Duchateau et al. |
| 5,344,793 A | 9/1994 | Zeininger et al. |
| 5,356,837 A | 10/1994 | Geiss et al. |
| 5,451,545 A | 9/1995 | Ramaswami et al. |
| 5,536,684 A | 7/1996 | Dass et al. |
| 5,567,651 A | 10/1996 | Bertl et al. |
| 5,728,279 A | 3/1998 | Schlott et al. |
| 5,736,461 A | 4/1998 | Bertl et al. |
| 5,747,373 A | 5/1998 | Yu |
| 5,780,362 A | 7/1998 | Wang et al. |
| 5,824,588 A | 10/1998 | Liu |
| 5,904,564 A | 5/1999 | Park |
| 5,970,370 A | 10/1999 | Besser et al. |
| 5,989,988 A | 11/1999 | Iinuma et al. |
| 6,022,457 A | 2/2000 | Huang et al. |
| 6,022,795 A | 2/2000 | Chen et al. |
| 6,025,274 A | 2/2000 | Lin et al. |
| 6,083,817 A | 7/2000 | Nogami et al. |
| 6,100,191 A | 8/2000 | Lin et al. |
| 6,190,516 B1 | 2/2001 | Xiong et al. |
| 6,251,780 B1 | 6/2001 | Sohn et al. |
| 6,323,130 B1 * | 11/2001 | Brodsky et al. ............ 438/682 |
| 6,376,373 B1 * | 4/2002 | Nakamura et al. .......... 438/683 |
| 6,413,859 B1 * | 7/2002 | Cabral, Jr. et al. ......... 438/649 |
| 6,440,851 B1 * | 8/2002 | Agnello et al. ............. 438/682 |
| 6,444,578 B1 * | 9/2002 | Cabral, Jr. et al. ......... 438/682 |

OTHER PUBLICATIONS

Goto, et al., "Optimization of Salicid Processes for Sub 0.1–um CMOS Devices," 1994 Symposium on VLSI Technology Digest of Technical Papers, pp. 119–120.

Iunuma, et al., "Highly Uniform Heteroepitaxy of Cobalt Silicide by Using Co–Ti Alloy for Sub–quarter Micron Devices," 1998 Symposium on VLSI Technology Digest of Technical Papers, pp. 188–189.

Sohn, et al., "Effects of Ti–Capping on Formation and Stability of Co Silicide," Journal of the Electrochemical Society 147(1) pp. 373–380, 2000.

* cited by examiner

Primary Examiner—Michael Trinh
Assistant Examiner—Christy Novacek
(74) Attorney, Agent, or Firm—J. Nicholas Gross

(57) ABSTRACT

A cluster tool and a number of different processes for making a cobalt-silicide material are disclosed. Combinations of alloyed layers of Co—Ti— along with layers of Co— are arranged and heat treated so as to effectuate a silicide reaction. The resulting structures have extremely low resistance, and show little line width dependence, thus making them particularly attractive for use in semiconductor processing. A cluster tool is configured with appropriate sputter targets/heat assemblies to implement many of the needed operations for the silicide reactions, thus resulting in higher savings, productivity, etc.

12 Claims, 7 Drawing Sheets

FIRST EMBODIMENT

Second Embodiment

Third Embodiment

METHOD AND SYSTEM FOR MAKING COBALT SILICIDE

FIELD OF THE INVENTION

This invention relates to a process and system for making a cobalt silicide material suitable for a semiconductor manufacturing process.

BACKGROUND OF THE INVENTION

Deep submicron (DSM) complementary metal oxide semiconductor (CMOS) circuits make extensive use of interconnects and contacts, and these latter features must be scaleable as well to ensure smooth migrations to smaller geometries. Connections to and between active CMOS FET devices are typically created with so-called "silicide" contacts, in which a portion of a source/drain region is converted during a thermal treatment into a metallic low resistance region. Silicidation reactions are well-known, and state of the art manufacturing processes in the 0.18 micron realm typically utilize some form of TiSi2 material as a gate and active region contact. However TiSi2 has several limitations, including linewidth-dependent sheet resistance, low thermal stability, and the fact that titanium can consume an unpredictable amount of silicon during the salicidation reaction. Such characteristics severely handicap the potential for TiSi2 in next generation technologies.

Cobalt silicide (CoSi2) has recently been advocated as a replacement for TiSi2.

One example of a prior art technique disclosing the making and use of CoSi2 is Goto et. al. "Optimization of Salicide Process for sub 0.1 um CMOS Devices" 1994 Symposium on VLSI Technology Digest of Technical Papers, page 119. Cobalt, however, is not without its limitations and problems as well. For instance, Cobalt is sensitive to oxygen and water. Even using very high purity inert gas for the heat treatment, the resulting cobalt silicide is often oxygen contaminated and a sheet resistance of the cobalt salicide thus increases. To prevent such oxidization of the cobalt layer, Goto discloses a cobalt salicide process using a Ti or TiN cap layer on top of the cobalt layer. Thus, a cobalt layer is deposited on a wafer having a top surface comprised of a mixture of exposed surfaces, including dielectric (typically sidewall and isolation) surfaces and silicon surfaces (typically gate and source/drain regions). A Ti or TiN cap layer is deposited on the cobalt layer without exposing the cobalt layer to air. The wafer is then subjected to a first anneal. During the first anneal cobalt reacts with silicon at the surface of the wafer where silicon contacts with cobalt. After the first anneal the wafer is etched in a NH4OH, H2O2, H2O solution and then with a HCl, H2O2, H2O solution. This two-step wet process etches away any metals which are not silicided, that is, Co, Ti, TiN and mixtures thereof. The wafer is then subjected to a second annealing process. In this process conventional semiconductor process quality N2 can be used during the first annealing. After this first anneal the Ti or TiN cap prevents residual oxygen from reacting with Co; therefore the resistance of the produced cobalt salicide does not increase due to an oxygen contamination problem.

As mentioned earlier, to prevent oxidation during silicidation, Ti and TiN are most widely used for capping a Co layer in the Co salicide process. The two materials have different strengths and weaknesses in this regard. For instance, TiN is more stable and does not react much with the Co layer. Nonetheless, Ti is more favored at this time, in large part because Ti is more reactive toward oxygen, and therefore is a potentially a better cap for preventing oxidation of Co. A Ti cap is also known to produce a more thermally stable Co salicide film. This fact is disclosed in Sohn et al. "Effects of Ti-capping on formation and stability of Co silicide" Journal of The Electrochemical Society 147 (1) page 373–380, 2000.

The use of Ti capping on Co however results in a complicated silicidation reaction. As Sohn points out, during the first anneal, Si reacts with Co to form a CoSix layer, consisting of primarily CoSi and CoSi2; Ti diffuses into the Co layer as Co reacts with Si; the Co and Ti form a layer of intermetallic mixture and the Ti layer experiences some nitridation. All these reactions take place in the same time causing complex process control consequences. This phenomenon is illustrated generally in FIG. 14.

In addition, for a Ti capped Cobalt silicide process, the first anneal temperature typically needs to be higher than for a comparable TiN capped process. This is a result of the effect of Ti diffusion into the Co layer and the resulting mediation of the silicidation reaction by Ti. In other words, in a Ti-mediated cobalt silicidation process, the presence of Ti retards the Co—Si reaction so that higher anneal temperatures are needed to complete the total reaction. According to Sohn, Ti diffuses into the Si interface and silicide grain boundary, thus stabilizing the final CoSi2 film,. Not all deposited Co reacts to form silicide because some Co reacts with the Ti and is converted into a Co—Ti intermetallic mixture layer. Usually in conventional processes, a Ti cap of 1 to 2 times the thickness of Co is used. Using such a large amount of Ti in turn affects the amount of Co that can ultimately react with silicon. All of these effects are hard to predict and control, and this makes the task of process engineering with cobalt silicide quite complicated. For instance, the final thickness of Cobalt silicide needs to be precisely controlled for more advanced generation of process because of the scaling down of source and drain junction depth.

Thus, although the conventional Co salicide process generally meets the requirement of advanced process of less than 0.1 um feature size, there is need to further improve the Co salicide process, and to ensure that it will be useable even below such feature size. There is a substantial need in the industry to have an extremely small feature size/line width Co silicide process that achieves such scaled down thicknesses yet has good thermal stability to withstand anneal temperature near 800 to 900 degrees centigrade without agglomeration. Furthermore, there is a need to be able to control the process with a better process margin, especially as pertains to the thickness and the sheet resistance of the Co silicide film. Finally, there is an additional pressing need for a basic process flow and process tool for forming Co salicide that achieves a higher productivity in conventional semiconductor manufacturing.

SUMMARY OF THE INVENTION

A primary object of the present invention therefore is to provide a solution to many of the aforementioned problems associated with the manufacturing of cobalt silicide.

A related object is to provide a high performance, easily manufacturable contact material suitable for a variety of semiconductor applications, including in self-aligned silicide (SALICIDE) applications;

Another object of the present invention is to provide an improved integrated deposition system that is capable of depositing and treating various semiconductor layers, including high performance silicides such as cobalt silicide;

Yet another object of the present invention is to provide cost effective, reliable Co silicide processes suitable for mass implementation of next generation IC technologies in conventional semiconductor fabrication facilities.

A first aspect of the invention therefore concerns a method of forming silicide materials on a silicon based substrate in which a combination of Co an Co—Ti is used. This includes generally the steps of: depositing a first metal layer on the silicon based substrate, the first metal layer including Cobalt (Co); and depositing a second metal layer on at least selected portions of the first metal layer, the second metal layer including an alloy of Cobalt and a refractory metal; and performing a first heat treatment so as to convert at least part of the first metal layer and the silicon based substrate into a first silicide composition having one or more cobalt silicide phases, the one or more cobalt silicide phases being characterized by a first resistivity; and performing a second heat treatment so as to convert the first composition, including the one or more cobalt silicide phases, into a second silicide composition containing primarily a lower resistivity cobalt silicide phase, the lower resistivity cobalt silicide phase having a resistivity substantially less than the first resistivity.

In a preferred approach for this aspect of the invention, the alloy is a composition including 20 to 80 percent atomic Titanium. In addition, a further step of removing any non-suicides after step (c) is also performed in most instances. Further in a preferred approach, an additional step of: cleaning the silicon substrate so as to substantially remove any non-native oxides is done prior to step (a). In addition, the alloy is preferably a ternary composition of Cobalt, Titanium, and one additional refractory metal and/or carbon.

Further in a preferred approach of this aspect of the invention, steps (a) through (c) are performed in a single semiconductor wafer processing cluster tool, and without exposing a wafer to ambient between such steps. This further increases reliability, productivity and throughput.

Another aspect of the invention concerns forming Co based silicide materials on a silicon based substrate within a cluster tool, and comprising the steps of: depositing a first metal layer on at least selected portions of the silicon based substrate within a first processing chamber of a semiconductor process cluster tool, the first metal layer including an alloy of Cobalt and a refractory metal (preferably Ti). The alloy includes a percentage of refractory metal in the range of 1 to approximately 10 percent. A first heat treatment is performed within the semiconductor process cluster tool so as to convert at least part of the first metal layer and the silicon based substrate into a first silicide composition having one or more cobalt silicide phases, the one or more cobalt silicide phases being characterized by a first resistivity. After this, a purge treatment within the semiconductor process cluster tool is performed using a noble gas so as to remove contaminants and reactive gasses at least prior to steps (a) and/or (b). Then, a second heat treatment converts the first composition, including the one or more cobalt silicide phases, into a second silicide composition containing primarily a lower resistivity cobalt silicide phase, the lower resistivity cobalt silicide phase having a resistivity substantially less than the first resistivity.

In a preferred approach, the first heat treatment is performed as an in-situ anneal while the first metal layer is being deposited. Because a small amount of titanium is used in the target the resulting silicide contains trace amounts of the same.

A related aspect of the invention pertains to a method of forming silicide materials in which both sputtering and heat processing operations are performed, to effectuate a type of high temperature sputtering of an alloy layer containing an alloy of Cobalt (Co) and a second refractory metal onto a silicon based substrate. The Co is present in the alloy layer in an amount sufficient for forming a low resistivity salicide contact with the silicon based substrate. While the sputtering is taking place, the silicon based substrate is heated in-situ (by a heating lamp) at a temperature and time sufficient to cause at least partial salicidation of the silicon based substrate and the alloy layer. The final salicidation is achieved during a subsequent heating step, which is at a higher temperature, and which can also be performed in-situ at the same processing station of a cluster chamber.

Yet another aspect of the invention is directed to a method of forming silicide materials on a silicon based substrate using two different layers of cobalt. This process generally include the following steps: (a) depositing a first metal layer on the silicon based substrate, the first metal layer including including an alloy of Cobalt and a refractory metal; and (b) depositing a second metal layer on the silicon based substrate, the second metal layer including a concentration of Cobalt exceeding that of the first metal layer; and (c) performing a first heat treatment substantially contemporaneously with step (b) so as to convert at least part of the first metal layer, the second metal layer and the silicon based substrate into a first silicide composition having one or more cobalt silicide phases, the one or more cobalt silicide phases being characterized by a first resistivity; and (d) performing a second heat treatment so as to convert the first composition, including the one or more cobalt silicide phases, into a second silicide composition containing primarily a lower resistivity cobalt silicide phase, the lower resistivity cobalt silicide phase having a resistivity substantially less than the first resistivity.

In a preferred approach, the alloy includes about 20 to 80 atomic percent of Ti, and the second metal layer includes a second alloy of Cobalt and a refractory metal. As before, steps (a), (b) and (c) preferably occur within a single semiconductor wafer processing cluster tool.

Yet another aspect of the invention concerns a method of operating a cluster tool to effectuate the aforementioned Co silicide processes and reactions. One representative example uses the following steps: (a) cleaning the silicon based wafer to remove any native oxides and/or contaminants; and (b) out-gassing the silicon based wafer. At this point, the silicon based wafer is substantially water-mark free. Thereafter in step (c) a first metal layer is sputtered on the silicon based wafer using an alloy target comprising cobalt (Go) and at least one refractory metal. Then a step (d) annealing the silicon based wafer in a first anneal treatment to cause the cobalt to react with silicon located on the silicon based wafer is performed. To enhance reliability and productivity, steps (b) through (e) are performed in a single semiconductor wafer processing cluster tool.

Since many cluster tools do not include wet etching, such steps are performed on the silicon based wafer at a processing station separate from the single semiconductor wafer processing cluster tool to remove metals other than silicides. Furthermore, the outgassing step can also occur in a load-lock chamber of the single semiconductor wafer processing cluster tool.

Still another aspect of the invention is directed to a cluster tool for performing semiconductor processing operations on a wafer. The cluster tool is adapted to have: (a) a load lock chamber for receiving the wafer; and (b) a sputter chamber equipped with a cobalt alloy target for sputtering a target material on the wafer; and (c) a heat annealing apparatus for heating the wafer at a rate and temperature sufficient to cause a silicide reaction between the sputtered target material and the wafer.

The load lock chamber is preferably used for outgassing of the wafer. The sputter chamber and the heat annealing apparatus are preferably integrated in a single processing station to effectuate an in-situ, high temperature sputtering operation. A second sputter chamber is also equipped with a second target including cobalt for sputtering a second target material on the wafer. Furthermore, a cleaning station is adapted for performing a cleaning operation on the wafer prior to any sputter operation. Finally, in another variation, a target for the sputter chamber is adjustable in situ so that two different target materials can be deposited on the wafer without changing locations.

Other aspects of the present invention are directed to structures, compositions and semiconductor devices that are formed as a result of the aforementioned Co silicide reactions and processes, and using the cluster tools as described.

These and other aspects of the invention are now described in detail with reference to the attached drawings and other supporting materials provided herein.

DETAILED DESCRIPTION OF THE INVENTION

Figure 1:
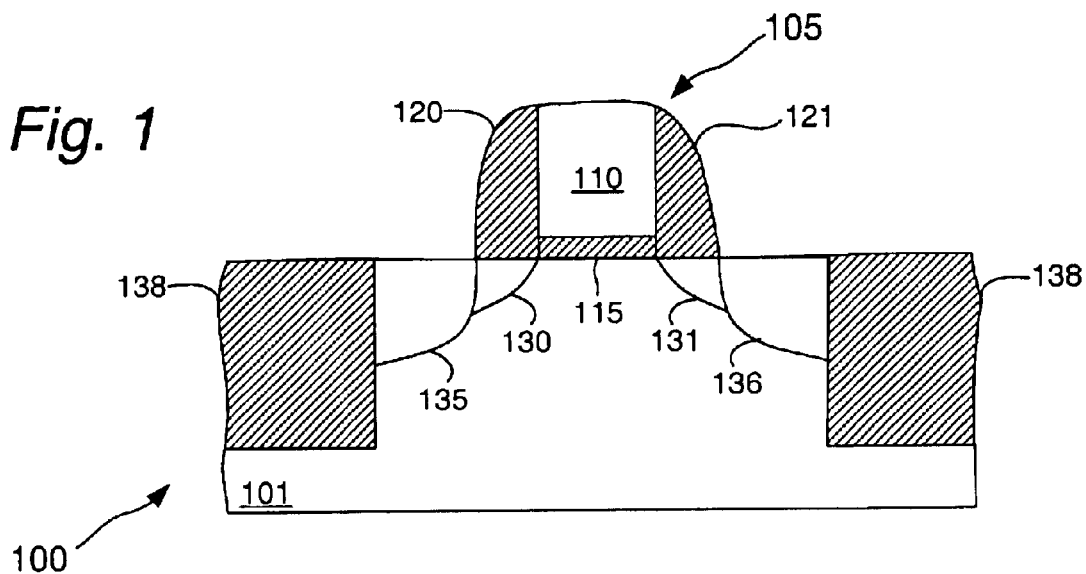
FIGS. 1 to 6 are cross sectional views generally illustrating an overall manufacturing method for making a layer of cobalt silicide, and a semiconductor device employing the same in accordance with a first embodiment of the present invention.

The following detailed description is meant to be illustrative only of particular embodiments of the invention. Other embodiments of the invention and variations of those disclosed will be obvious to those skilled in the art in view of the following description.
First Embodiment A preferred method employed by a first embodiment of the invention is depicted collectively in FIGS. 1 to 6. In FIG. 1, a cross-section of a semiconductor wafer 100 shows a conventional semiconductor device 105 formed in a lightly doped (n or p type) substrate 101, and which device typically has a doped (n or p type) polysilicon based gate electrode 110, a gate insulating film 115, dielectric (SiN) sidewall spacers 120, 121, shallow doped (n or p type) source/drain regions 130, 131 and deep doped (also n or p) source/drain regions 135, 136. Device 100 typically is also bordered by one or more isolation regions 138, consisting of various insulating films such as SiO2. The materials and manufacturing techniques used to create such starting structures ate well-known in the art, so in the interests of brevity and clarity they are not reproduced here. While the present invention is preferably used with a polysilicon based gate electrode 110, and silicon-based source/drain regions 135, 136, it will be apparent to those skilled in the art that the present teachings can be used with any suitable base material that can be controllably reacted with cobalt.

The exposed silicon surface portions (i.e., gate electrode 110, source/drain regions 135, 136) typically comprise both n type and p type doped regions for both polysilicon and substrate areas across wafer 100. The silicon substrate areas 135. 136 and polysilicon gate 110 are generally doped by P, As, B and Ge ion implanted impurities, and are usually covered with a thin native oxide (not shown) as noted earlier. This native oxide must be removed prior to the silicidation process to ensure proper contact formation.

To do this, wafer 100 is processed using any number of conventional techniques known in the art for removing or reducing native oxide on a silicon surface. In a preferred method, wafer 100 is processed with a HF dip preferably using deoxygenated water. Isopropyl alcohol drying of the wafer prevents water marks. HF dip and Isopropyl alcohol drying can be performed in a batch process as well as a single wafer process. Another approach is to use a HF vapor treatment to remove the native oxide. Another approach is to physically sputter wafer 100 to remove any native oxide. These latter two approaches are easily integrated in a cluster tool system, so that the oxide-removal treatment can be performed in one chamber and wafer 100 is then transferred to another chamber for metal sputter without being exposed to air in between steps.

In some applications an out-gassing step may also be included. Thus, an overall typical process for native oxide reduction includes the following sequence of steps: a HF dip, IPA drying and an out-gassing step. While out-gassing is usually performed in a reaction chamber, in some applications it can be performed in a load lock location as well.

Figure 2:
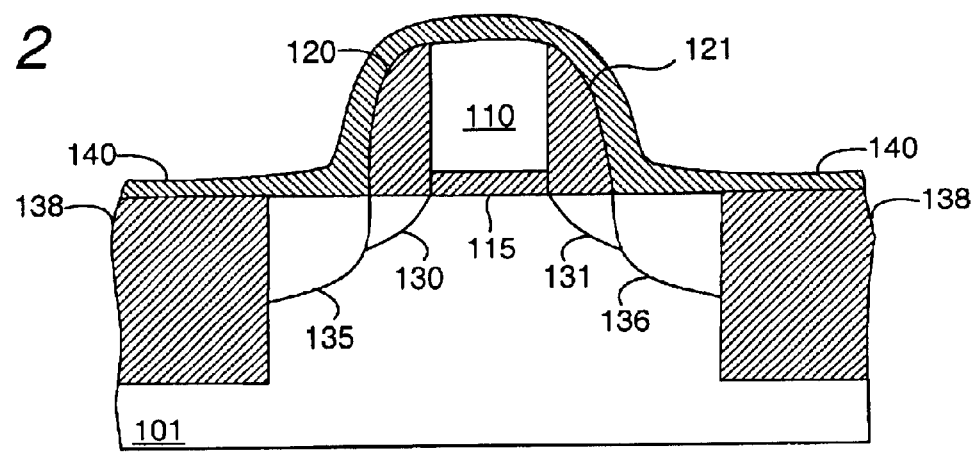

In any event, the cross section in FIG. 1 depicts wafer 100 after such native oxide reduction steps. Next, as shown in FIG. 2, wafer 100 is placed in a first sputter deposition chamber where a Cobalt (Co) layer 140 of about 10 nm is deposited over the entire wafer using a substantially pure cobalt target in a noble gas plasma environment. In a preferred approach, the first sputter deposition chamber is part of a cluster tool described in more detail with reference to FIG. 16 below.

Figure 3:
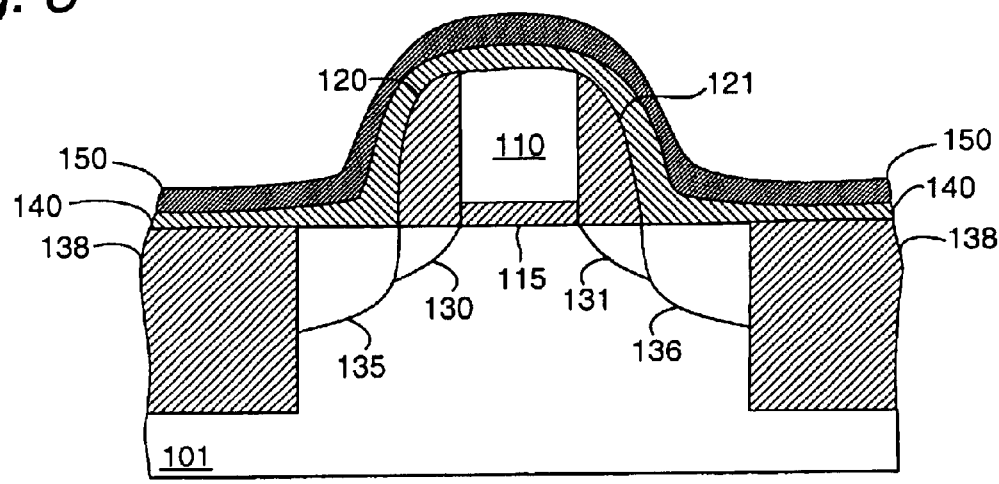

As seen in FIG. 3, the wafer is then moved to a second chamber to deposit a Co—Ti alloy cap layer 150 of about 15 nm using a Co—Ti target also in a noble gas plasma environment. The Co—Ti target is adapted to have a Ti content from about 20 to 80 atomic percent, preferably about 50 atomic percent. Of course, in some reactors it may be possible to change targets without removing wafer 100 from the first reaction chamber so that both the Co and Co—Ti cap layer are formed in the same chamber.

While Ti is used in this preferred embodiment, it will be apparent to those skilled in the art that other elements could be used depending on the desired film qualities, compatibility with subsequent deposition materials, etc., and provided such elements can provide the same degree of protection from oxygen. For example, any number of refractory metals may be suitable for a particular application. Refractory metals such as Ta, W, Mo, Zr, Hf, Nb are also known to mediate cobalt silicidation to form high quality cobalt silicide films just as Ti does. In this regard, it should be noted that the term "refractory metal" is not intended to limit the invention to these metals, and those skilled in the art will appreciate that other metals (positioned near these refractory metals on a periodic table) are also entirely suitable for the present invention.

After the Co—Ti capping, the wafer is transferred to an anneal chamber. This anneal chamber can be integrated to the same cluster tool that includes the aforementioned first and second reaction chambers, or it can be located elsewhere because of the protection afforded by Co—Ti cap layer 150. In those cases where the anneal chamber is not integrated to the same cluster tool, cap layer 150 is preferably formed as an amorphous layer. This can be achieved using conventional mechanisms by controlling the temperature of wafer 100 while depositing cap layer 150. As a further refinement, a ternary target with a small addition of a second refractory metal or a light element such as carbon can also be used to improve the quality of cap layer 150.

Figure 4:
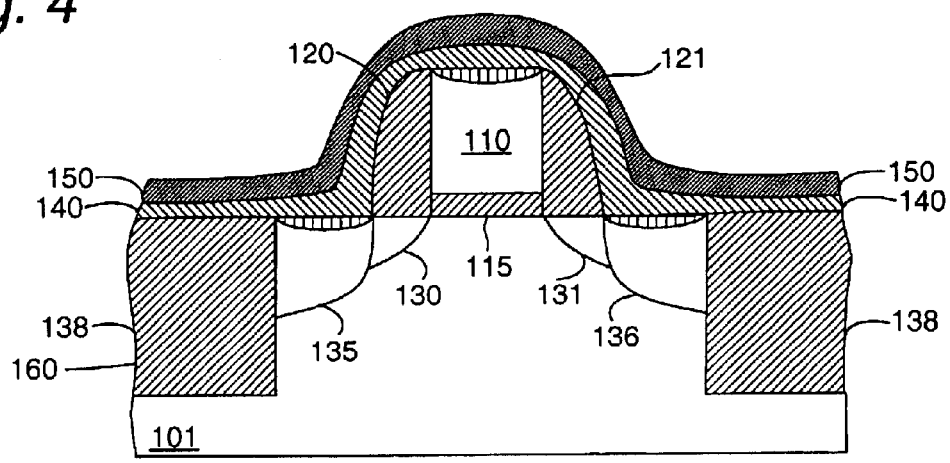

As shown in FIG. 4, a first anneal is performed for a relatively short period of time (about 60 seconds) and at about 500 to 650 degree centigrade in a nitrogen or an argon environment, using a conventional heat lamp apparatus. The actual times and temperatures will vary, of course, from heater to heater and for any particular combination of materials/thicknesses can be easily determined and optimized using routine skill. This first anneal operation causes a number of reactions, both within Co—Ti layer 150, Co layer 140, and at interfaces with the underlying silicon layers. For instance, Co layer 140 and silicon materials in the underlying silicon areas (gate electrode 110 and Source/Drain regions 135, 136) react to form certain compounds within layer 140, as well as at an interface 160 therebetween, including CoSi and Co2Si, which represent high resistivity phase silicides.

In some environments and in certain process windows it is conceivable that Titanium from Co—Ti layer 150 may be abstracted by nitrogen to the surface, where it can react to form a Ti/TiN layer (not shown). Since CoTi silicidation is a competing reaction against such abstraction, however, this additional type of layer is not expected to be a significant factor in embodiments of the present invention.

Figure 5:
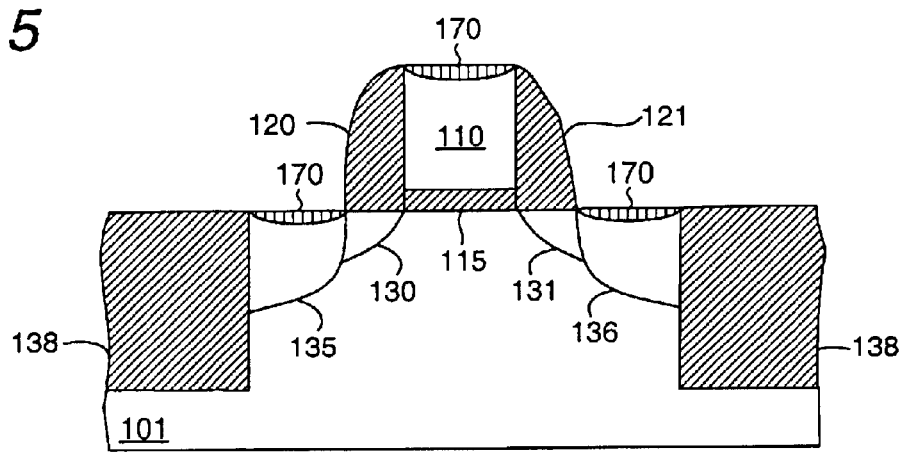

Wafer 100 is then selectively etched as illustrated in FIG. 5 to remove metals and mixtures other than the silicides formed in the prior step. Again, the various chemicals and procedures required for this step are well-known in the art, and the present invention is by no means limited in this respect.

Figure 6:
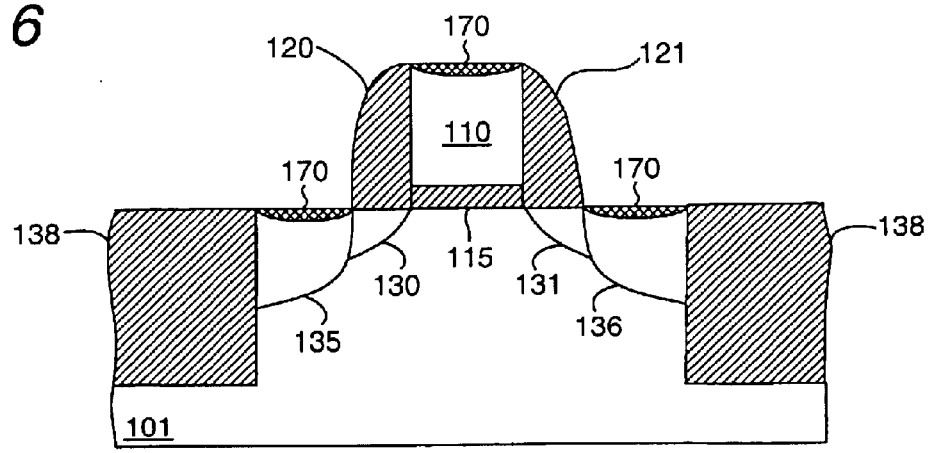

As seen in FIG. 6, wafer 100 is then subjected to a second anneal at about 750 to 900 degrees centigrade (in the same manner as before) and with a time sufficient to complete the silicidation process, that is, to transform the high resistance Co2Si and/or CoSi phase materials to a lower resistance CoSi2 phase material. As before, the optimal actual times and temperatures will vary, of course, depending on the specific materials, thicknesses, etc. of the deposited layers. This completes the formation of the cobalt silicide layer 170. Thereafter, wafer 100 may undergo any number of additional well-known processing steps (not shown) to provide interlayer dielectrics, contacts, interconnects, etc., to device 105, and to complete fabrication of such device.

Figure 14:
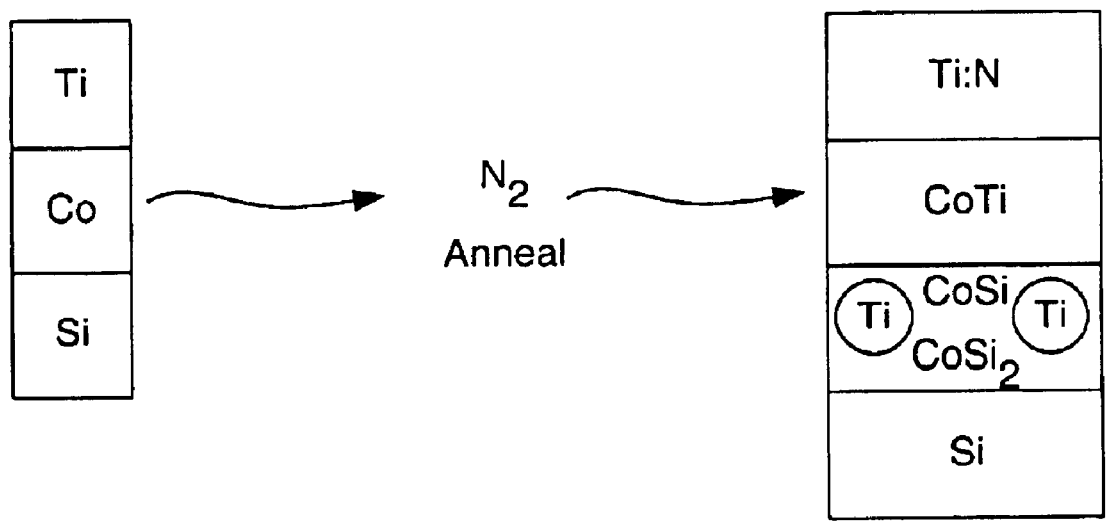
FIG. 14 depicts a cross section of a prior art scheme for forming cobalt silicide, including intermediate reactions results generated by an anneal step.
Figure 15:
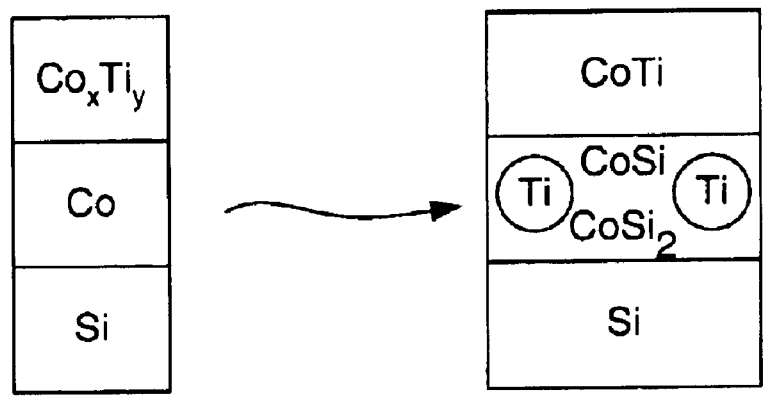
FIG. 15 depicts some of the intermediate reactions results generated by a cobalt silicide process of the present invention during an anneal step.

A cross sectional view of the result of the first anneal treatment is shown in FIG. 15, which can be contrasted with the result of the prior art at a similar stage shown in FIG. 14. As seen in FIG. 5, the intermediate reaction products of the present invention are similar, but the present invention instead advantageously initially deposits what is an end-result (Co—Ti) of the prior art process. This means that the present process is more predictable, because for a given amount of Co, a process engineer can better determine how much intermediate product (CoSi and Co2Si) will be formed.

While the Co—Ti alloy is less reactive to N2 than Ti, it is nonetheless still sufficiently reactive to oxygen and moisture to prevent any contamination problems. Thus, it performs well enough to prevent any performance issues with the resulting cobalt silicide layer. Moreover, like the Ti cap used in the prior art, the Co—Ti layer 150 of the present invention can act as a source for some Ti diffusion into the underlying Co layer 140. The presence of Ti mediates the silicidation reaction, which raises the temperature required to convert to the lower resistance CoSi2 phase, but it nonetheless enhances the thermal stability of the resulting cobalt silicide layer 170. At the same time, the Co—Ti cap layer 150 is less reactive than a pure Ti cap on Co; this means that there is less interaction between the cap layer and underlying Co films to adversely affect the amount of Co that is available for the silicidation reaction. This fact, in turn, means that process control is improved because the final thickness of the resulting silicide film is more easily controlled.

Furthermore, the resulting thickness can be very thin as compared to a prior art process, because less Ti has to be involved in the overall process. This also increases productivity, reduces cycle time, etc. In the present approach, only about 80 to 100 Angstroms of Cobalt are required to react with 350 Angstroms of silicon, resulting in an extremely dense combined silicide layer of approximately 330 Angstroms after final silicidation.

Second Embodiment

Figure 7:
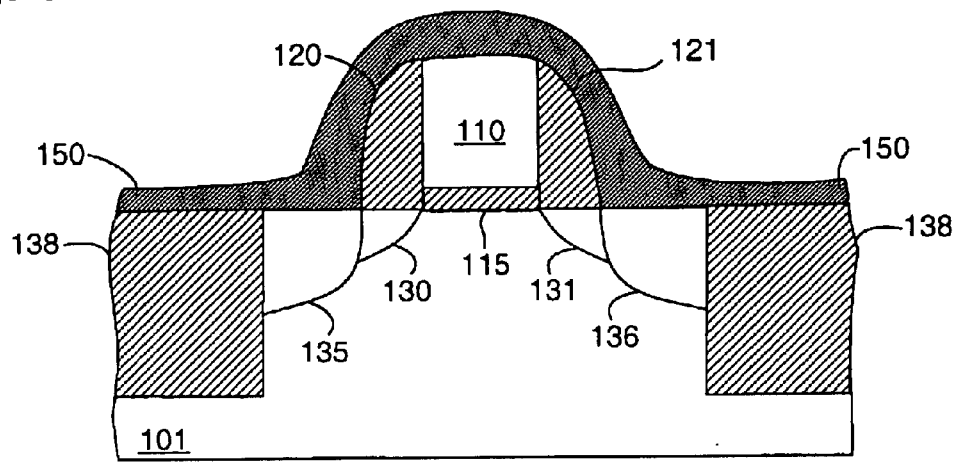
FIGS. 7 to 9 are cross sectional views generally illustrating an overall manufacturing method for making a layer of cobalt silicide, and a semiconductor device employing the same in accordance with a second embodiment of the present invention.
Figure 8:
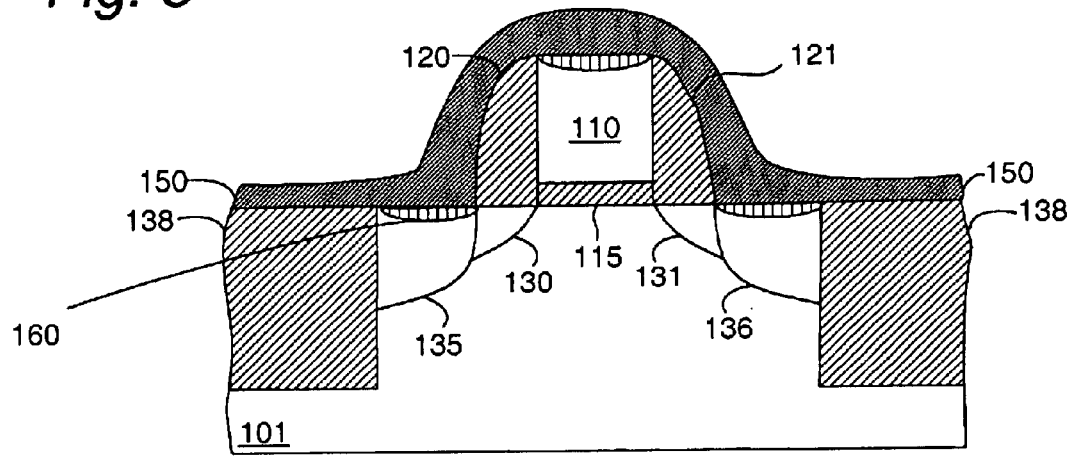
Figure 9:
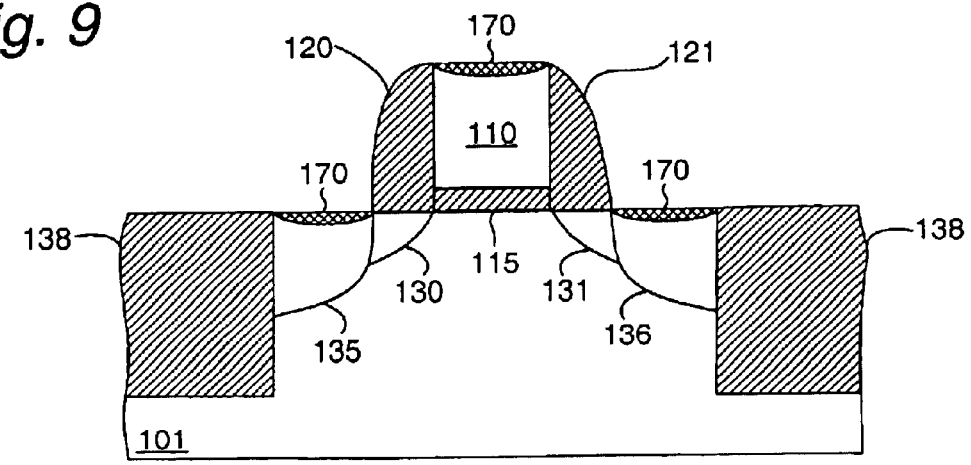

A preferred method employed by a second embodiment of the invention is depicted collectively in FIGS. 7 to 9. Unless otherwise noted, like numerals for the second embodiment are intended to refer to like structures as previously discussed in the first embodiment above.

As before with the first embodiment, a wafer 100 having dielectric surface and silicon surface is prepared. As before, wafer 100 is processed using any number of well-known techniques to remove or reduce native oxide.

As shown in FIG. 7, wafer 100 is then moved to a sputter chamber to deposit a Co—Ti layer 150 using a Co—Ti alloy target having a Ti content about 1 to 50 atomic percent (and preferably 1 to 10 percent) under an noble gas plasma environment, in this case, preferably argon.

A first anneal is performed at about 500 to 650 degree centigrade preferably in situ as seen in FIG. 8. This can be achieved by integrating a heating apparatus to the sputter chamber, such as a hot plate or a lamp. Thus, in this approach, an in-situ salicidation is performed during sputtering, in what can be considered a high temperature sputtering operation.

Alternatively, the first anneal could be performed in another chamber within the cluster tool in a similar manner (i.e., with a hot plate or heating lamp). Since the Si surface is free of oxide, and the ambient is free of N2, there is less tendency for Ti to migrate to the surface in this embodiment.

Unlike the first embodiment, no additional first layer of Co is deposited, because it is not necessary to do so. By carefully controlling the amount of Ti in the Co—Ti alloy target, it is possible to deposit a mixture that: (1) has sufficient Cobalt to react effectively with the underlying silicon; (2) and yet also has sufficient Ti to prevent contamination to the Cobalt from oxygen and other reactants.

To minimize this second effect, the cluster tool in this embodiment uses a noble gas such as argon for sputtering and purging any vacuum systems prior to critical operations such as a deposition operation. The point of using a noble gas purifier is that it can be used to remove trace reactive gasses such as oxygen, moisture and N2 before sputtering operations. In other words, it cuts down significantly on the number of reactive products that can adversely affect the underlying Co, so that less Ti is actually needed for controlling oxygen and moisture contamination. For this reason, in this embodiment, a target comprising 1–10 atomic percent of Ti can be used preferably.

At the same time, the resulting Co—Ti alloy layer 150 is sufficiently rich in Cobalt that it can react effectively to silicide later with the underlying silicon areas. Accordingly, the low percentage Ti alloy target provides enough Ti for forming a Ti-mediated cobalt silicide film yet does not consume too much cobalt by forming an Co—Ti intermetallic mixture. The Ti migrates during the various reactions, however, and in the end resulting silicide film, some residual Ti can be found in the cobalt silicide.

Finally, because the initial layer 150 is not purely Cobalt, it tends to react less with any initial residual oxide that may be on the surface of wafer 100, or later contaminants. This means that the overall process yield can be improved, because the operating environment and starting conditions do not need to be quite so strict or rigid.

After the first anneal wafer 100 is removed from the cluster tool and subjected to selective etch (as before) to remove metals other than silicide. The wafer is then rinsed, dried and subjected to a second anneal (as before) to convert the high resistance Co2Si and CoSi phase to low resistance CoSi2 phase as before, resulting in the structure shown in FIG. 9. This structure is otherwise identical in most respects to the resulting structure shown in FIG. 6.

The advantage of this second embodiment is the simplicity of the number of steps, and their sequence, enhances the productivity of the cluster tool. The cluster tool (FIG. 16) can process wafer 100 for many steps such as native oxide removal, Co—Ti alloy sputtering and the first anneal without exposing to air. The Co—Ti alloy layer 150 provides a Ti-mediated cobalt silicide layer 170 that has good thermal stability against agglomeration of the CoSi2 film under high temperature. In addition, the Co—Ti alloy layer 150 also provides some process margin such that neither native oxide removal nor the chamber environments need to be perfect.

Because the above embodiment uses an in-situ salicidation approach (in the form of high temperature sputtering— in this case, sputtering with lamp heating) it also has great potential to reduce leakage current of very shallow source/drain junctions required in next generation technologies.

Third Embodiment

A preferred method employed by a third embodiment of the invention is depicted collectively in FIGS. 10 to 13. Unless otherwise noted, like numerals for the second embodiment are intended to refer to like structures as previously discussed in the first embodiment above.

Figure 10:
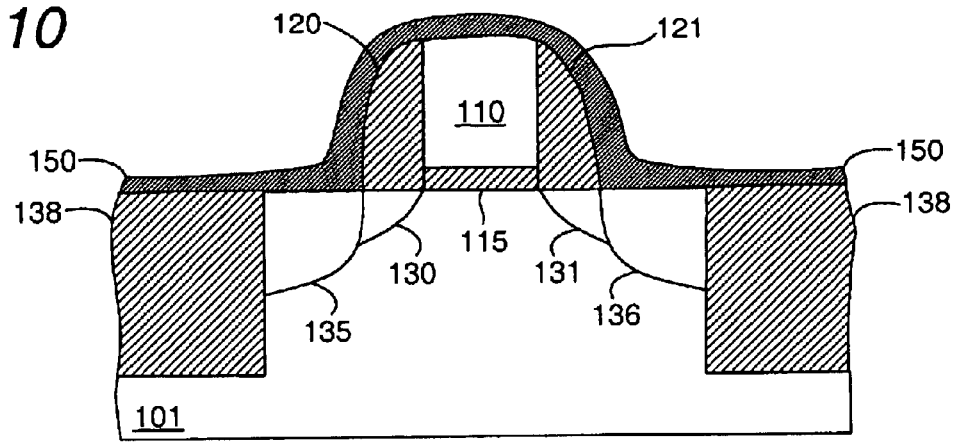
FIGS. 10 to 13 are cross sectional views generally illustrating an overall manufacturing method for making a layer of cobalt silicide, and a semiconductor device employing the same in accordance with a third embodiment of the present invention.

As above, wafer 100 is subjected to any number of procedures to remove or reduce native oxide. Next, as shown in FIG. 10, the wafer is moved to a sputter chamber to deposit a first layer 150 consisting of about 5 to 15 nm of a Co—Ti alloy, using a Co—Ti alloy target including about 20 to 80 atomic percent of Ti.

Figure 11:
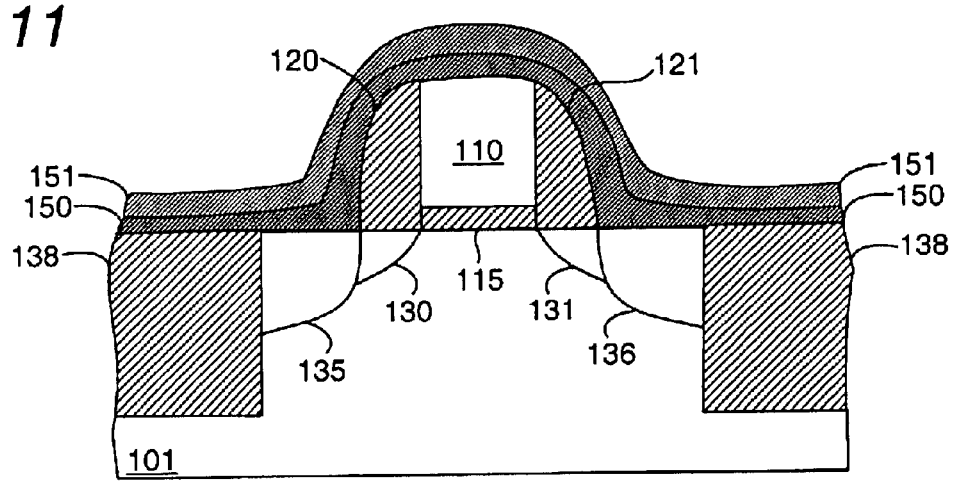

Next, in FIG. 11, wafer 100 is then moved to a second sputter chamber (preferably in the same cluster tool) to deposit either a Co layer 151, or a Co—Ti alloy layer 151 having a richer (higher percentage) Co content than the first Co—Ti layer 150. Both layers 150, 151 are deposited under noble gas environment plasma. In the second deposition wafer 100 is heated to about 500 to 650 degree centigrade, that is, an in situ anneal is performed within the sputtering chamber. The first Co—Ti alloy target is preferred to have a Ti content near or higher than 50 atomic percent so as to reduce an effective amount of Co available to form a silicide when heated in the second chamber. The second sputtering operation supplies additional Co to the wafer surface allowing Co2Si or CoSi to be formed during the process since heat is also provided. In this way, the final thickness of layers 150, 151 is easier to control.

Figure 12:
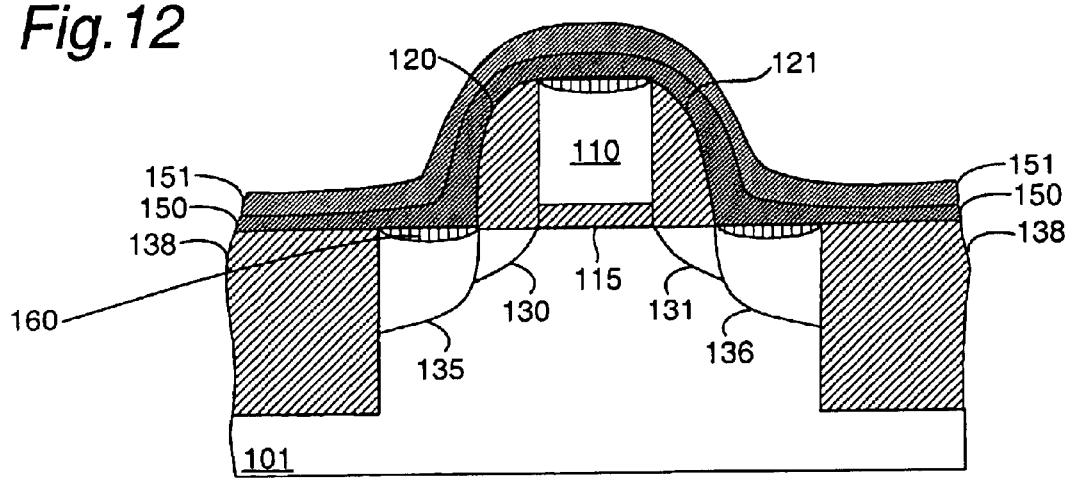
Figure 13:
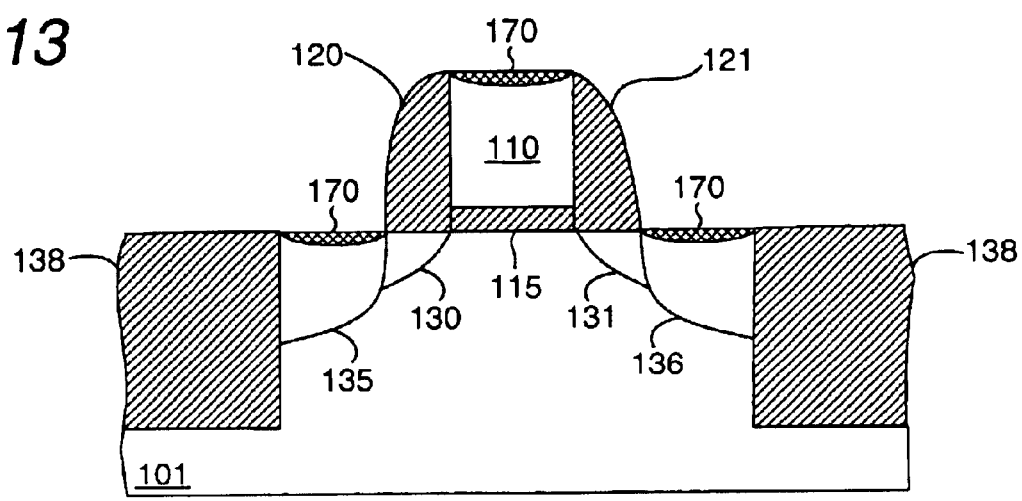

As before, wafer 100 is treated with a selective etch to remove metals other than silicide. The wafer is then rinsed, dried and annealed for the second time as shown in FIG. 12 to convert the Co2Si and CoSi phase materials to the lower resistance CoSi2 phase. The resulting layer 170 of FIG. 13 is substantially the same as that shown already in FIGS. 6 and 9.

Cluster Tool Embodiment

Figure 16:
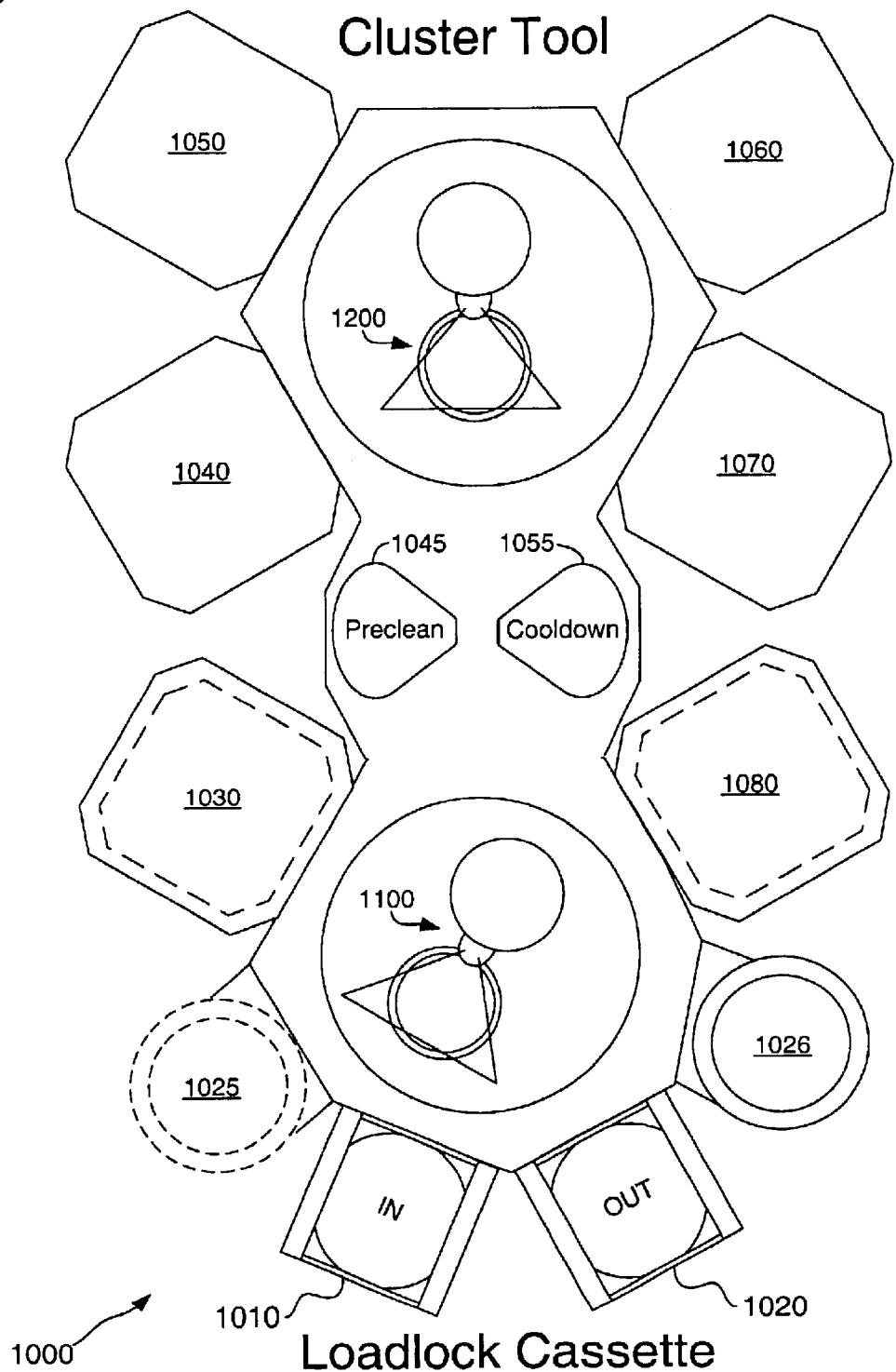
FIG. 16 generally illustrates a preferred embodiment of a deposition/reaction system configured in accordance with the teachings of the present invention for depositing and forming silicide materials.

An improved semiconductor processing system 1000 is depicted generally in FIG. 16, which is based generally on a conventional cluster tool system such as the Endura® HP PVD System sold by Applied Materials. As seen generally in this figure, system 1000 includes a set of loadlock chambers 1010 and 1020 for receiving/pre-processing incoming wafers and/or outputting finished wafers. For example, outgassing operations can typically be performed in such loadlock chambers. A variety of processing chambers 1030–1080, and wafer handling stations 1100 and 1200 are also part of the system. To accommodate the processes of the present invention, system 1000 includes one or more modified sputter chambers 1040, in which a Co—Ti target is used (in lieu of a conventional sputtering target) or a combination of separate stations using both a Co-based target and a Co—Ti alloy target are used for depositing separate Co and Co—Ti layers.

The Endura® system also already includes a precleaning station, where one or more of the aforementioned wafer cleaning operations can be performed. In addition, one or more sputter chambers 1050 (or 1060 or 1070) also include some form of heating assembly, so that heating operations, including in-situ anneals, can be performed directly on wafers 100 without having to remove the wafers from the cluster tool. When sputter chamber 1040 (with an alloy target) includes an integrated heating lamp, for example, a high temperature sputtering operation noted earlier can be conveniently performed for in-situ salicidation. Wafer handling stations 1100 and 1200 ensure that the wafers move smoothly from station to station without breaking vacuum, and so as to avoid contamination.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A method of forming silicide materials on a silicon based substrate comprising the steps of:
    (a) depositing a first metal layer on the silicon based substrate, said first metal layer including Cobalt (Co); and
    (b) depositing a second metal layer on at least selected portions of the first metal layer, said second metal layer including an alloy of Cobalt and a refractory metal; and
    (c) performing a first heat treatment so as to convert at least part of said first metal layer and the silicon based substrate into a first suicide composition having one or more cobalt silicide phases, said one or more cobalt silicide phases being characterized by a first resistivity;
    (d) performing a second heat treatment so as to convert said first composition, including said one or more cobalt suicide phases, into a second silicide composition containing primarily a lower resistivity cobalt suicide phase, said lower resistivity cobalt suicide phase having a resistivity substantially less than said first resistivity.

2. The method of claim 1, wherein said alloy is a composition including 20 to 80 percent atomic Titanium.

3. The method of claim 1, further including a step of: removing any non-silicides after step (c).

4. The method of claim 1, further including a step of: cleaning said silicon substrate so as to substantially remove any non-native oxides prior to step (a).

5. The method of claim 1, wherein said alloy is a ternary composition of Cobalt, Titanium, and one additional refractory metal and/or carbon.

6. The method of claim 1, wherein steps (a) through (c) are performed in a single semiconductor wafer processing cluster tool, and without exposing a wafer to ambient between such steps.

7. A method of forming suicide materials on a silicon based substrate comprising the steps of:
    (a) depositing a first metal layer on the silicon based substrate, said first metal layer including including an alloy of Cobalt and a refractory metal; and
    (b) depositing a second metal layer on the silicon based substrate, said second metal layer including a concentration of Cobalt exceeding that of said first metal layer; and
    (c) performing a first heat treatment substantially contemporaneously with step (b) so as to convert at least part of said first metal layer, said second metal layer and the silicon based substrate into a first suicide composition having one or more cobalt silicide phases, said one or more cobalt silicide phases being characterized by a first resistivity; and
    (d) performing a second heat treatment so as to convert said first composition, including said one or more cobalt suicide phases, into a second silicide composition containing primarily a lower resistivity cobalt silicide phase, said lower resistivity cobalt suicide phase having a resistivity substantially less than said first resistivity.

8. The method of claim 7 further including a step: (e) selective wet etching the silicon based wafer at a processing station to remove metals other than silicides, said processing station being separate from a single semiconductor wafer processing cluster tool used for a least steps (a) through (c).

9. The method of claim 7, wherein steps (a) and (b) occur within a single physical vapor deposition chamber of a single semiconductor wafer processing cluster tool.

10. The method of claim 7, wherein an outgassing step occurs in a loadlock chamber of a single semiconductor wafer processing cluster tool.

11. The method of claim 7, wherein said alloy includes about 20 to 80 atomic percent of Ti.

12. The method of claim 11, further including a step (e) annealing the silicon based wafer in a second anneal treatment to cause suicides of said cobalt to further react and form lower resistance cobalt silicides.

* * * * *